United States Patent
Ishibashi et al.

(10) Patent No.: US 9,871,275 B2
(45) Date of Patent: Jan. 16, 2018

(54) BATTERY-STATE ESTIMATION DEVICE

(71) Applicant: Panasonic Intellectual Property Management Co., Ltd., Osaka (JP)

(72) Inventors: Tatsuya Ishibashi, Osaka (JP); Hiroshi Tenmyo, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 124 days.

(21) Appl. No.: 14/911,261

(22) PCT Filed: Sep. 18, 2014

(86) PCT No.: PCT/JP2014/004814
§ 371 (c)(1),
(2) Date: Feb. 9, 2016

(87) PCT Pub. No.: WO2015/064004
PCT Pub. Date: May 7, 2015

(65) Prior Publication Data
US 2016/0190658 A1    Jun. 30, 2016

(30) Foreign Application Priority Data

Oct. 29, 2013    (JP) .................................. 2013-223938

(51) Int. Cl.
G01N 27/416    (2006.01)
H01M 10/42    (2006.01)
(Continued)

(52) U.S. Cl.
CPC ... H01M 10/4285 (2013.01); H01M 10/0525 (2013.01); H01M 10/48 (2013.01);
(Continued)

(58) Field of Classification Search
CPC ..... Y02E 60/12; H01M 10/484; H01M 10/48; G01R 31/3651; G01R 31/3627
(Continued)

(56) References Cited

U.S. PATENT DOCUMENTS 8,907,674 B2 * 12/2014 Takahashi .......... G01R 31/3634
324/427
2010/0001693 A1 * 1/2010 Iida ..................... G01R 31/3679
320/134
(Continued)

FOREIGN PATENT DOCUMENTS

JP    2006-015896    1/2006
JP    2010-066229    3/2010
(Continued)

OTHER PUBLICATIONS

International Search Report of PCT application No. PCT/JP2014/004814 dated Dec. 16, 2014.

*Primary Examiner* — Arun Williams
(74) *Attorney, Agent, or Firm* — McDermott Will & Emery LLP

(57) ABSTRACT

A battery-state estimation device obtains, at a first timing, a first resistance value corresponding to a first open circuit voltage of a lithium-ion secondary battery and a second resistance value corresponding to a second open circuit voltage, which is higher than the first open circuit voltage, of the lithium-ion secondary battery. Further, the battery-state estimation device obtains, at a second timing which is different from the first timing, a third resistance value corresponding to the first open circuit voltage and a fourth resistance value corresponding to the second open circuit voltage. The battery-state estimation device determines presence or absence of lithium deposition in the lithium-ion secondary battery, based on a magnitude relation between a first variation amount of the third resistance value with
(Continued)

respect to the first resistance value and a second variation amount of the fourth resistance value with respect to the second resistance value.

4 Claims, 8 Drawing Sheets

(51) Int. Cl.
  *H01M 10/0525* (2010.01)
  *H01M 10/48* (2006.01)
  *H02J 7/00* (2006.01)
  *G01R 31/36* (2006.01)

(52) U.S. Cl.
  CPC .......... *H02J 7/0021* (2013.01); *H02J 7/0047* (2013.01); *G01R 31/362* (2013.01); *G01R 31/3658* (2013.01); *G01R 31/3662* (2013.01); *G01R 31/3679* (2013.01); *H01M 2010/4278* (2013.01); *H01M 2220/20* (2013.01); *Y02E 60/122* (2013.01); *Y02T 10/7011* (2013.01); *Y02T 10/7055* (2013.01)

(58) Field of Classification Search
  USPC ........................................................ 324/432
  See application file for complete search history.

(56) References Cited

U.S. PATENT DOCUMENTS

| | | | |
|---|---|---|---|
| 2011/0161025 A1* | 6/2011 | Tomura | G01R 31/3651 702/63 |
| 2011/0206952 A1 | 8/2011 | Mano et al. | |
| 2012/0098489 A1* | 4/2012 | Arai | B60L 3/0046 320/109 |
| 2012/0215472 A1* | 8/2012 | Tezuka | B60L 3/12 702/63 |
| 2012/0226455 A1 | 9/2012 | Kumashiro et al. | |
| 2013/0076363 A1 | 3/2013 | Takahashi et al. | |
| 2014/0055144 A1 | 2/2014 | Mano et al. | |
| 2015/0338468 A1* | 11/2015 | Kaiya | H02J 7/00 324/432 |

FOREIGN PATENT DOCUMENTS

| | | |
|---|---|---|
| JP | 2010-066232 | 3/2010 |
| JP | 2011-171213 | 9/2011 |
| JP | 2011-222343 | 11/2011 |
| JP | 2011-258337 | 12/2011 |
| JP | 2012-181976 | 9/2012 |

* cited by examiner

| COMBINATION OF OPEN CIRCUIT POTENTIALS OF POSITIVE ELECTRODE AND NEGATIVE ELECTRODE | POSITIVE ELECTRODE | | NEGATIVE ELECTRODE | |
|---|---|---|---|---|
| | DC-IR (Ω) | C (Ah) | DC-IR (Ω) | C (Ah) |
| (V1C1,V1A1) | rc1 | cc1 | ra1 | ca1 |
| (V1C2,V1A2) | rc2 | cc2 | ra2 | ca2 |
| ... | ... | ... | ... | ... |
| (V1Cn-1,V1An-1) | rcn-1 | ccn-1 | ran-1 | can-1 |
| (V1Cn,V1An) | rcn | ccn | ran | can |

BATTERY-STATE ESTIMATION DEVICE

CROSS-REFERENCE TO RELATED APPLICATIONS

This application is a U.S. national stage application of the PCT International Application No. PCT/JP2014/004814 filed on Sep. 18, 2014, which claims the benefit of foreign priority of Japanese patent application 2013-223938 filed on Oct. 29, 2013, the contents all of which are incorporated herein by reference.

TECHNICAL FIELD

The present invention relates to a battery-state estimation device for a lithium-ion secondary battery.

BACKGROUND ART

A storage battery system is known which is equipped with a battery-state estimation device for estimating a deterioration state of a lithium-ion secondary battery. In order to estimate the deterioration state of a lithium-ion secondary battery, one conventional method determines presence or absence of lithium deposition. In order to determine the presence or absence of lithium deposition, in one conventional method, a lithium-ion secondary battery is discharged at a constant current; the discharge is stopped when the battery voltage is decreased to a predetermined discharge stop voltage; and based on an amount of recovery of the battery voltage after that, the presence or absence of lithium deposition is determined (see PTL 1 below).

CITATION LIST

Patent Literature

PTL 1: Unexamined Japanese Patent Publication No. 2011-171213

SUMMARY OF THE INVENTION

The above method may be able to determine the presence or absence of lithium deposition and to thus estimate the deterioration state of a lithium-ion secondary battery; however, the battery needs to be discharged at a constant current until the voltage is decreased to the discharge stop voltage. Therefore, for example, if it is difficult to discharge at a constant current because of fluctuation of electric power supplied to a load, it is difficult to determine the presence or absence of lithium deposition. In addition, after the discharge at a constant current, it is necessary to measure an amount of a voltage recovery; therefore, discharge to outside or charge from outside may be limited while the determination of the presence or absence of lithium deposition is being performed.

In view of the above, an object of the present invention is to provide a battery-state estimation device which can estimate a deterioration state of a lithium-ion secondary battery by a simple method without interfering with charge or discharge operation to or from outside.

A battery-state estimation device according to the present invention includes an obtaining unit which obtains, at a first timing, a first resistance value corresponding to a first open circuit voltage of a lithium-ion secondary battery and a second resistance value corresponding to a second open circuit voltage, which is higher than the first open circuit voltage, of the lithium-ion secondary battery, and the battery-state estimation device obtains, at a second timing which is different from the first timing, a third resistance value corresponding to the first open circuit voltage and a fourth resistance value corresponding to the second open circuit voltage. The battery-state estimation device further includes a determination unit which determines presence or absence of lithium deposition in the lithium-ion secondary battery, based on a magnitude relation between a variation amount of the third resistance value with respect to the first resistance value and a variation amount of the fourth resistance value with respect to the second resistance value.

The present invention provides a battery-state estimation device which can estimate a deterioration state of a lithium-ion secondary battery by a simple method without interfering with charge or discharge operation from or to outside.

DESCRIPTION OF EMBODIMENT

In the following, an example of an exemplary embodiment of the present invention will be specifically described with reference to the drawings. In the reference drawings, the same parts are assigned the same reference marks, and the same parts will not be described again in principle.

Figure 1:
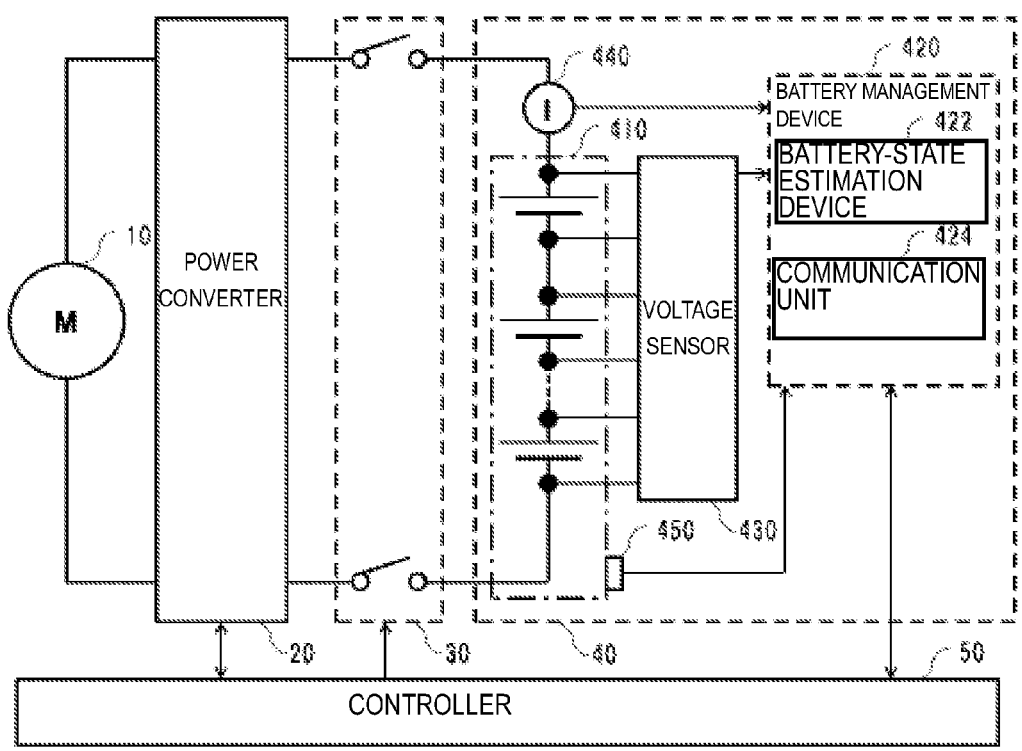
FIG. 1 is a diagram for illustrating a storage battery system according to an exemplary embodiment of the present invention.

FIG. 1 is a diagram for illustrating storage battery system 40 according to the exemplary embodiment of the present invention. In the present exemplary embodiment, storage battery system 40 is assumed to be installed in a vehicle as a source of power for an HEV (Hybrid Electric Vehicle), a PHEV (Plug-in Hybrid Electric Vehicle), an EV (Electric Vehicle), and the like.

Running motor 10 is, for example, a three-phase AC synchronous motor. Power converter 20 is coupled to storage battery system 40 through relay 30. Power converter 20 converts, at the time of power running, DC power supplied from storage battery system 40 into an alternating current and supplies the alternating current to running motor 10. Further, at the time of regeneration, power converter 20 converts AC power supplied from running motor 10 into DC power and supplies the DC power to storage battery system 40.

Relay 30 is controlled to be in an open state or a closed state by a relay control signal from controller 50. In the closed state, relay 30 connects power converter 20 and storage battery system 40 to form a charging and discharging path. Further, in the open state, relay 30 breaks the charging and discharging path between power converter 20 and storage battery system 40.

Controller 50 electronically controls whole the vehicle. Controller 50 sets a value of a required torque to be output to running motor 10, based on an amount of user's operation of an accelerator, a vehicle speed, information from the storage battery system, or the like. Controller 50 controls power converter 20 so that running motor 10 operates according to the value of the required torque. For example, if the value of the required torque becomes greater, controller 50 controls power converter 20 so that the electric power corresponding to the value of the required torque is supplied to running motor 10. Further, if the value of the required torque becomes smaller, controller 50 controls power converter 20 so that electric power generated by running motor 10 using deceleration energy as an energy source is supplied to storage battery system 40.

Storage battery system 40 includes battery module 410, battery management device 420, voltage sensor 430, current sensor 440, and temperature sensor 450.

Battery module 410 includes one or more storage batteries (also referred to as a "secondary batteries"). The present exemplary embodiment assumes that a lithium-ion secondary battery is used as the storage battery included in battery module 410. With reference to FIG. 1, a plurality of series connected storage batteries B1 to Bn constitute battery module 410; however, a number of storage batteries constituting battery module 410 may be one. A part of or all of the storage batteries included in battery module 410 may be parallel connected to each other. Note that, in the present exemplary embodiment, the storage battery refers to a single battery unless otherwise indicated.

Battery module 410 is coupled to power converter 20 through relay 30. Battery module 410 can be supplied with charging electric power through power converter 20 when running motor 10 is operating as a source of electric power (at the time of regeneration). Further, battery module 410 can supply discharging electric power through power converter 20 when running motor 10 is operating as a load (at the time of power running).

Voltage sensor 430 detects a voltage value Vd of a terminal voltage of each of storage batteries B1 to Bn constituting battery module 410 (a voltage difference between a positive electrode and a negative electrode of each of storage batteries B1 to Bn). Voltage sensor 430 outputs the detected voltage values Vd of the storage batteries to battery management device 420.

Current sensor 440 is disposed between battery module 410 and power converter 20 so as to measure a current value Id of current flowing through battery module 410. Current sensor 440 outputs the detected current value Id to battery management device 420.

Temperature sensor 450 detects a temperature Td of battery module 410 (for example, a surface temperature of battery module 410). Temperature sensor 450 outputs the detected temperature T to battery management device 420.

Battery management device 420 includes battery-state estimation device 422 and communication unit 424. Battery-state estimation device 422 estimates a battery-state such as presence or absence of lithium deposition in battery module 410 and SOC (State Of Charge, also referred to as a "charging rate") by using battery-state data including the current value Id, the voltage value Vd, and the temperature Td.

Communication unit 424 transmits, to controller 50, information about the battery state such as the SOC estimated by battery-state estimation device 422. Battery management device 420 and controller 50 are coupled to each other by a network such as the CAN (Controller Area Network).

Prior to specifically describing battery-state estimation device 422, a general description will be given of an operation estimating the presence or absence of lithium deposition, performed in battery-state estimation device 422.

Each of the lithium-ion secondary batteries constituting battery module 410 includes a negative electrode, a separator containing electrolyte, and a positive electrode (which are not shown). Each of the negative electrodes and the positive electrodes is made up of an aggregation of active material.

When the lithium-ion secondary battery is discharged, on a boundary surface of the active material of each negative electrode, there occurs a chemical reaction in which lithium ions Li+ and electrons e− are released. On the other hand, on a boundary surface of the active material of each positive electrode, there occurs a chemical reaction in which lithium ions Li+ and electrons e− are adsorbed. When the lithium-ion secondary battery is charged, reactions opposite to the above reactions occur.

On the negative electrode there is provided a current-collector plate which adsorbs electrons from the active material at the time of discharge, and on the positive electrode there is provided a current-collector plate which releases electrons to the active material at the time of discharge. Lithium ions are given and taken between the positive electrode and the negative electrode through the separator, and thus the lithium-ion secondary battery is charged and discharged. For example, at the time of discharge, the lithium ions Li+ released from the negative electrode are moved to the positive electrode by diffusion and migration and are absorbed in the positive electrode.

Resistance which acts, equivalently to electric resistance, to the lithium ions Li+ coming out of and getting into the electrode surface is referred to as a "charge transfer resistance". A DC resistance component of an electric resistance is referred to as a "DC-IR (Direct Current Internal Resistance)", where the electric resistance is an electric resistance when the lithium-ion secondary battery is macroscopically viewed, and where the electric resistance includes the charge transfer resistance and purely electric resistance acting to the electrons e– moving on the negative electrode and on the positive electrode. Note that, in the present exemplary embodiment, the DC-IR means an internal resistance unless otherwise indicated.

Figure 2:
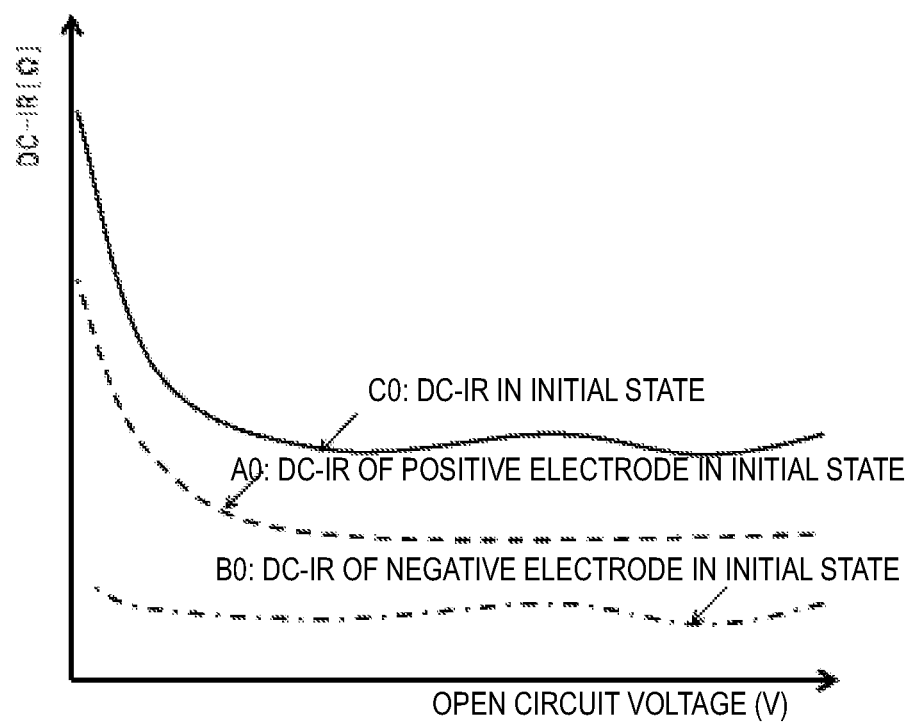
FIG. 2 is a conceptual diagram showing a correspondence relation between a DC-IR and an open circuit voltage in a lithium-ion secondary battery at an initial state.

FIG. 2 is a conceptual diagram showing the correspondence relation between a DC-IR and an open circuit voltage (OCV) of the lithium-ion secondary battery in an initial state (the DC-IR of the lithium-ion secondary battery is simply referred to as a "DC-IR", too). Here, the initial state is a state that there is no deterioration having occurred in a lithium-ion secondary battery and is a state, for example, immediately after the lithium-ion secondary battery is manufactured.

As shown in FIG. 2, the DC-IR C0 in the initial state is obtained by combining the DC-IR A0 of the positive electrode with the DC-IR B0 of the negative electrode. With reference to FIG. 2, the resistance value of the DC-IR A0 of the positive electrode increases as the open circuit voltage decreases. This is considered to be because, as more lithium ions Li+ are taken into the positive electrode, the fewer places can hold lithium ions Li+ and thus lithium ions Li+ are less likely to be absorbed in the positive electrode.

Here, assume that a case where the deterioration due to lithium deposition (also referred to as "lithium-deposition-related deterioration") has occurred, in other words, a case where the lithium ions Li+ released from the positive electrode are not absorbed in the negative electrode but are deposited on the surface of the negative electrode. In this case, even if the negative electrode releases all the lithium ions Li+ absorbed in the negative electrode at the time of charge, the lithium ions Li+ deposited on the surface of the negative electrode cannot return to the positive electrode. Therefore, the DC-IR of the positive electrode corresponding to the same open circuit voltage is smaller than that in the initial state by the amount corresponding to the lithium ions Li+ which cannot return to the positive electrode. In other words, if lithium-deposition-related deterioration has occurred, a part of the lithium ions Li+ released from the positive electrode at the time of charge cannot return to the positive electrode at the time of discharge; thus, the positive electrode composition and the negative electrode composition do not correspond to each other.

Figure 3:
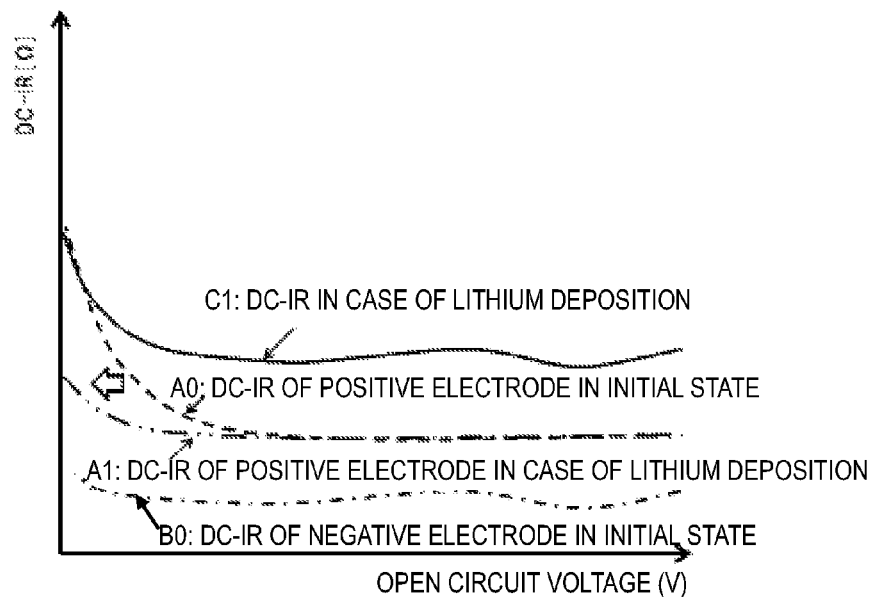
FIG. 3 is a conceptual diagram showing a correspondence relation between the DC-IR and the open circuit voltage in a lithium-ion secondary battery in which lithium-deposition-related deterioration has occurred.

FIG. 3 is a conceptual diagram showing a correspondence relation between the DC-IR and the open circuit voltage in the case where lithium-deposition-related deterioration has occurred. When the positive electrode composition and the negative electrode composition do not equally correspond to each other, the DC-IR of the negative electrode in the case where lithium-deposition-related deterioration has occurred does not change but remains to be the DC-IR B0 of the negative electrode in the initial state, as shown in FIG. 3. On the other hand, the DC-IR of the positive electrode in the case where the lithium-deposition-related deterioration has occurred becomes to be the DC-IR A1 of the positive electrode which is obtained by parallel displacing to the left (the direction in which the open circuit voltage is smaller) the DC-IR A0 of the positive electrode in the initial state. The DC-IR C1 in the case where the lithium-deposition-related deterioration has occurred is obtained by combining the DC-IR A1 of the positive electrode in the case where the lithium-deposition-related deterioration has occurred with the DC-IR B0 of the negative electrode in the initial state.

The deterioration of a lithium-ion secondary battery generally includes the deterioration due to lithium deposition and the deterioration due to wear (also referred to as "wear deterioration"). Wear deterioration is a deterioration in which the repetition of charge and discharge or the storage lowers the performance of the positive electrode and the negative electrode in taking in lithium, and examples include wearing of the active material in the positive electrode and the negative electrode due to change in volumes associated with repetition of charge and discharge. Further, the examples of wear deterioration include formation of a film on the active material surface.

Figure 4:
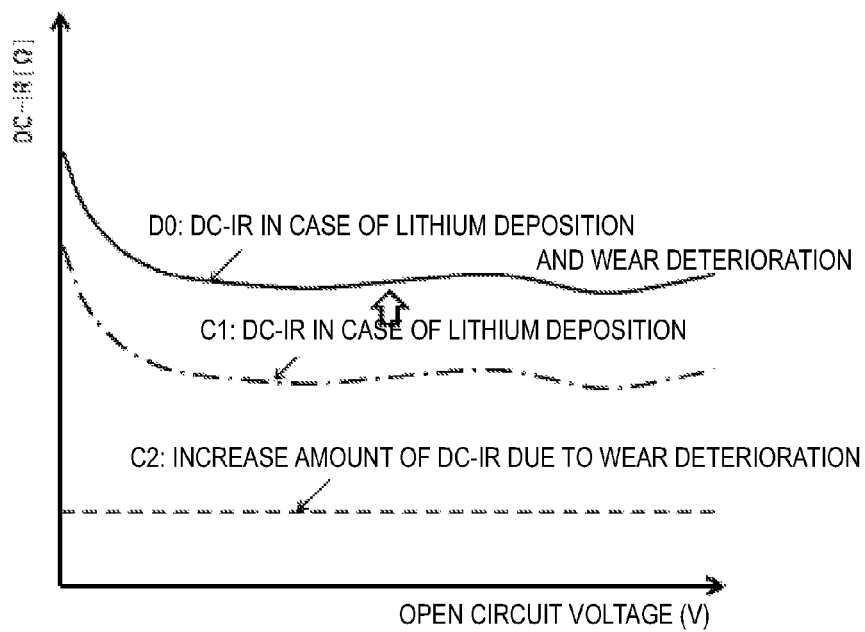
FIG. 4 is a conceptual diagram showing a correspondence relation between the DC-IR and the open circuit voltage in a lithium-ion secondary battery in which lithium-deposition-related deterioration and wear deterioration have occurred.

FIG. 4 is a conceptual diagram showing a correspondence relation between the DC-IR and the open circuit voltage in the case where lithium-deposition-related deterioration and wear deterioration have occurred. In the case where wear deterioration has occurred, as shown by the DC-IR C2 in FIG. 4, in many cases, an increase amount of the DC-IR is almost equal in the whole range of the open circuit voltage. The DC-IR D0 in the case where lithium-deposition-related deterioration and wear deterioration have occurred is obtained by combining the DC-IR C1 in the case where the deposition-related deterioration has occurred with the DC-IR C2 corresponding to the increase amount due to the wear deterioration.

As shown in FIG. 4, the DC-IR D0 in the case where lithium-deposition-related deterioration and wear deterioration have occurred can also be obtained by parallel displacing upward the DC-IR C1 in the case where the lithium-deposition-related deterioration has occurred by the amount corresponding to the wear deterioration.

As shown in FIG. 2, the curved line representing the positive electrode DC-IR A0 in the initial state exhibits a characteristic that the curved line has a steep slope and monotonously decreases in a range of the lower open circuit voltage (also referred to as a "first range") and that the curved line has a gentle slope and is flat in a range of the higher open circuit voltage (also referred to as a "second range"). In the case where lithium-deposition-related deterioration has occurred, since the curved line representing the positive electrode DC-IR A0 parallel displaces to the left in FIG. 3, a comparison between before and after the parallel displacement shows that the DC-IR decreases in the first range but the DC-IR does not change much in the second range.

On the other hand, in the case where wear deterioration has occurred, the DC-IR increases by approximately the same amount in the first range and the second range.

Therefore, when one open circuit voltage is selected in each of the first range and the second range, and when a variation amount of the DC-IR in the case where lithium-deposition-related deterioration and wear deterioration have occurred with respect to the DC-IR in the initial state (also simply referred to as a "variation amount of the DC-IR") is obtained at each of the selected open circuit voltages, the comparison between the two variation amounts shows that the variation amount in the second range is greater. This is because, in the first range, the amount of increase of the DC-IR due to the wear deterioration is reduced because of the amount of the decrease in the DC-IR due to the lithium deposition, and because in the second range, the amount of decrease in the DC-IR due to the lithium deposition effects is less than in the first range. In other words, if the variation amount of the DC-IR in the second range is greater than the variation amount of the DC-IR in the first range, lithium deposition is determined to have occurred.

In view of the above, in the exemplary embodiment of the present invention, the variation amount of the DC-IR is obtained at each of an open circuit voltage in the first range (also referred to as a "first open circuit voltage") and an open circuit voltage in the second range (also referred to as a "second open circuit voltage"), and the variation amounts are compared with each other to determine the presence or absence of lithium deposition. In the following, with reference to FIGS. 5 and 6, a specific description will be given of a method according to the exemplary embodiment of the present invention for determining lithium deposition.

Figure 5:
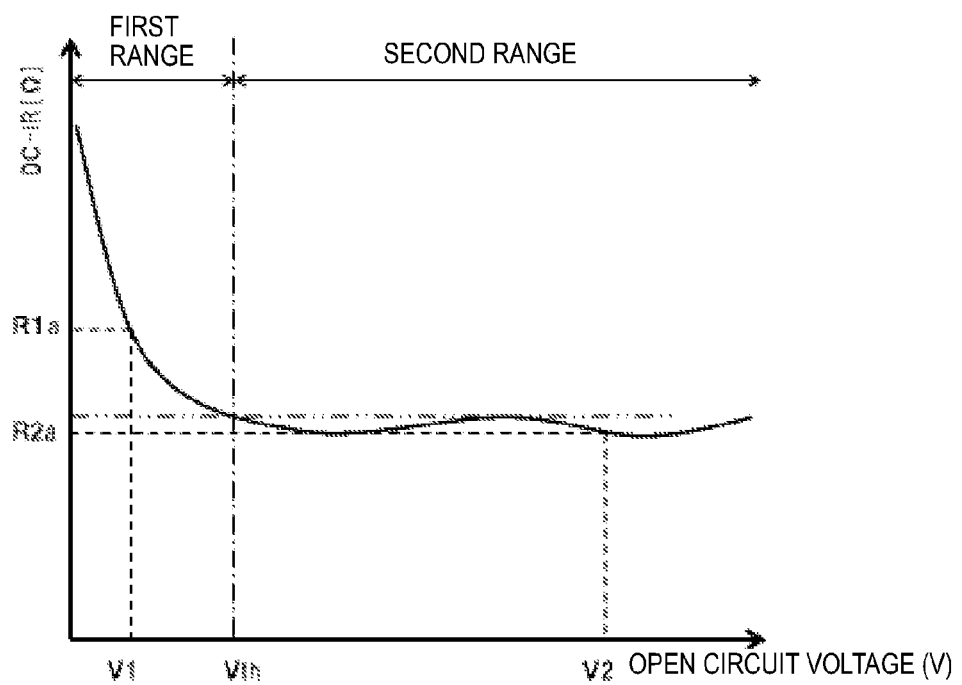
FIG. 5 is a conceptual diagram showing a correspondence relation between the DC-IR and the open circuit voltage, in a lithium-ion secondary battery in the initial state, in a first range in which the open circuit voltage is low and in a second range in which the open circuit voltage is higher than that in the first range.
Figure 6:
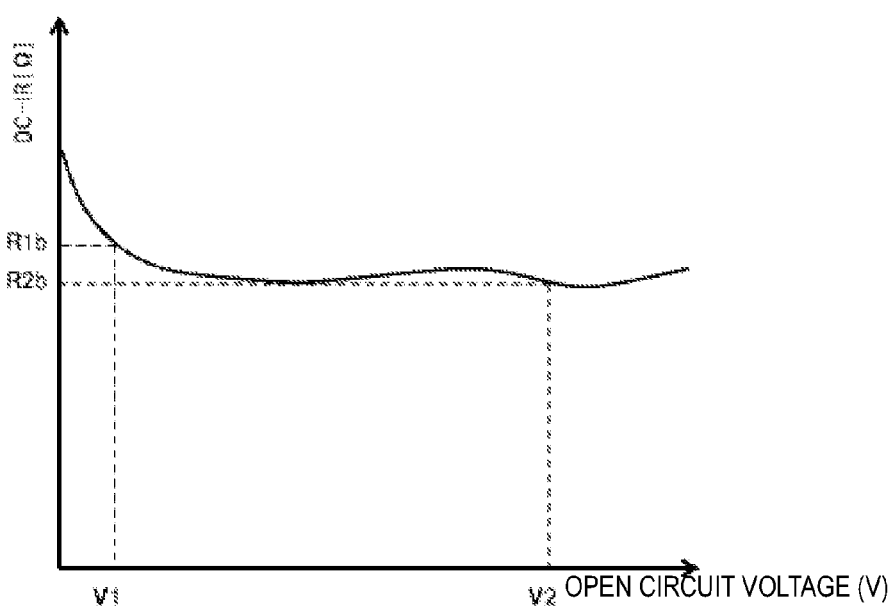
FIG. 6 is a conceptual diagram showing a correspondence relation between the DC-IR and the open circuit voltage, in a lithium-ion secondary battery in which lithium-deposition-related deterioration and wear deterioration have occurred, in the first range, in which the open circuit voltage is low, and in the second range, in which the open circuit voltage is higher than that in the first range.

FIG. 5 is a conceptual diagram showing a correspondence relation between the DC-IR in the initial state and the open circuit voltage in each of the first range, in which the open circuit voltage is low, and the second range, in which the open circuit voltage is higher than that in the first stage. Further, FIG. 6 is a conceptual diagram showing a correspondence relation between (i) the DC-IR in the case where lithium-deposition-related deterioration and wear deterioration have occurred and (ii) the open circuit voltage, in each of the first range, in which the open circuit voltage is low, and the second range, in which the open circuit voltage is higher than that in the first stage.

With reference to FIG. 5, the resistance value of the DC-IR corresponding to the first open circuit voltage V1 is represented by R1a (also referred to as a "first resistance value"), and the resistance value of the DC-IR corresponding to the second open circuit voltage V2 is represented by R2a (also referred to as a "second resistance value"). In the same way, with reference to FIG. 6, the resistance value of the DC-IR corresponding to the first open circuit voltage V1 is represented by R1b (also referred to as a "third resistance value"), and the resistance value of the DC-IR corresponding to the second open circuit voltage V2 is represented by R2b (also referred to as a "fourth resistance value").

In the method according to the exemplary embodiment of the present invention for determining lithium deposition, the variation amount of the DC-IR in the first range is calculated as a difference value (also referred to as a "first difference value") by the following equation (1).

$$D1 = (R1b - R1a) \quad (1)$$

Further, the variation amount of the DC-IR in the first range is calculated as a ratio (also referred to as a "first ratio") by the following equation (2).

$$R1 = (R1b/R1a) \quad (2)$$

In the same way, the variation amount of the DC-IR in the second range is calculated as a difference value (also referred to as a "second difference value") by the following equation (3).

$$D2 = (R2b - R2a) \quad (3)$$

Further, the variation amount of the DC-IR in the second range is calculated as a ratio (also referred to as a "second ratio") by the following equation (4).

$$R2 = (R2b/R2a) \quad (4)$$

Then, the first difference value D1 and the second difference value D2 are compared with each other, and the first ratio R1 and the second ratio R2 are compared with each other. If the second difference value D2 and the second ratio R2 are greater, lithium deposition is determined to have occurred.

Since the presence or absence of lithium deposition is determined based on the variation amount of the DC-IR in each of the first range and the second range as described above, the determination method can be easily performed without interfering with charge or discharge operation. In addition, since the determination is made based on the difference value and the ratio, the presence or absence of lithium deposition can be determined without fail.

Note that, in the method according to the exemplary embodiment of the present invention for determining lithium deposition, the DC-IR is detected as the local maximum DC-IR when the DC-IR stops increasing and start decreasing with increase in the open circuit voltage as shown in FIG. 5. The threshold voltage Vth is the open circuit voltage which is lower than the open circuit voltage corresponding to the local maximum DC-IR and at which the DC-IR is equal to the local maximum DC-IR. Then, the open circuit voltage is divided into the first range and the second range, where the first range is a range in which the open circuit voltage is lower than the threshold voltage Vth, and the second range is a range in which the open circuit voltage is higher than the threshold voltage Vth.

As shown in FIG. 5, the curved line representing the correspondence relation between the DC-IR and the open circuit voltage shows a characteristic that the curved line has a steep slope and monotonously decreases in the range in which the open circuit voltage is lower than the threshold voltage Vth and that the curved line has a gentle slope and is flat in the range in which the open circuit voltage is higher than the threshold voltage Vth. As described above, if the curved line representing the correspondence relation between the DC-IR and the open circuit voltage is flatter in the second range than in the first range, lithium deposition can be determined more accurately. Therefore, since the open circuit voltage is divided into the first range and the second range as described above, the presence or absence of lithium deposition can be accurately determined.

Next, the method according to the exemplary embodiment of the present invention for determining lithium deposition will be described in the case where the method is applied to correction of an SOC-OCV table representing the correspondence relation between the SOC and the OCV.

The SOC-OCV table is referred to, for example, when the SOC is estimated from the OCV; however, the correspondence relation between the SOC and the OCV varies depending on the battery state of the lithium-ion secondary battery. For this reason, when a lithium-ion secondary battery has been deteriorated, it is desirable to make a correction such that the deterioration is reflected on the SOC-OCV table.

In view of the above, in a method according to the exemplary embodiment of the present invention for correcting the SOC-OCV table, if lithium deposition is detected based on the above-described method for determining lithium deposition, a required compensation amount is calculated, and the SOC-OCV table is corrected. In the following, with reference to FIGS. 7 and 8, a specific description will be given of a method according to the exemplary embodiment of the present invention for correcting the SOC-OCV table.

Figure 7:
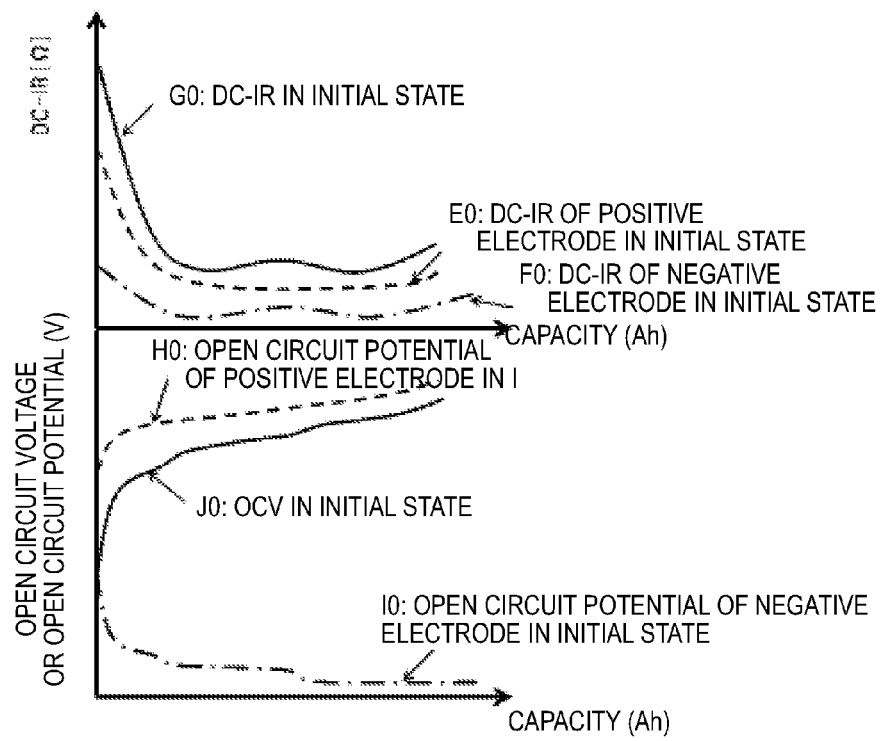
FIG. 7 is a conceptual diagram showing correspondence relations between the DC-IR and the open circuit voltage, and a capacity in a lithium-ion secondary battery in the initial state.

FIG. 7 is a conceptual diagram showing the correspondence relation between each of the DC-IR and the open circuit voltage in the initial state and a capacity. Further, FIG. 8 is a conceptual diagram showing the correspondence relation between each of the DC-IR and the open circuit voltage and the capacity in the case where lithium-deposition-related deterioration has occurred.

With reference to FIG. 7, the capacity represented by the horizontal axis is commonly used. On the upper side of the vertical axis, the DC-IR G0 shows the correspondence relation between the DC-IR and the capacity of the lithium-ion secondary battery. On the lower side of the vertical axis, the OCV J0 shows the correspondence relation between the open circuit voltage and the capacity of the lithium-ion secondary battery. The DC-IR G0 is obtained by combining the DC-IR E0 of the positive electrode with the DC-IR F0 of the negative electrode. Further, the OCV J0 is represented by the voltage difference between the open circuit potential H0 of the positive electrode and the open circuit potential I0 of the negative electrode. Hereinafter, the open circuit potential of each of the positive electrode and the negative electrode is also referred to as an "OCP (Open Circuit Potential)".

As shown in FIG. 7, as more lithium ions Li+ move to the negative electrode and are absorbed in the negative electrode, the open circuit potential H0 of the positive electrode becomes higher, and the open circuit potential I0 of the negative electrode becomes lower. To the contrary, as more lithium ions Li+ move to the positive electrode and are absorbed in the positive electrode, the open circuit potential H0 of the positive electrode becomes lower, and the open circuit potential I0 of the negative electrode becomes higher.

Figure 8:
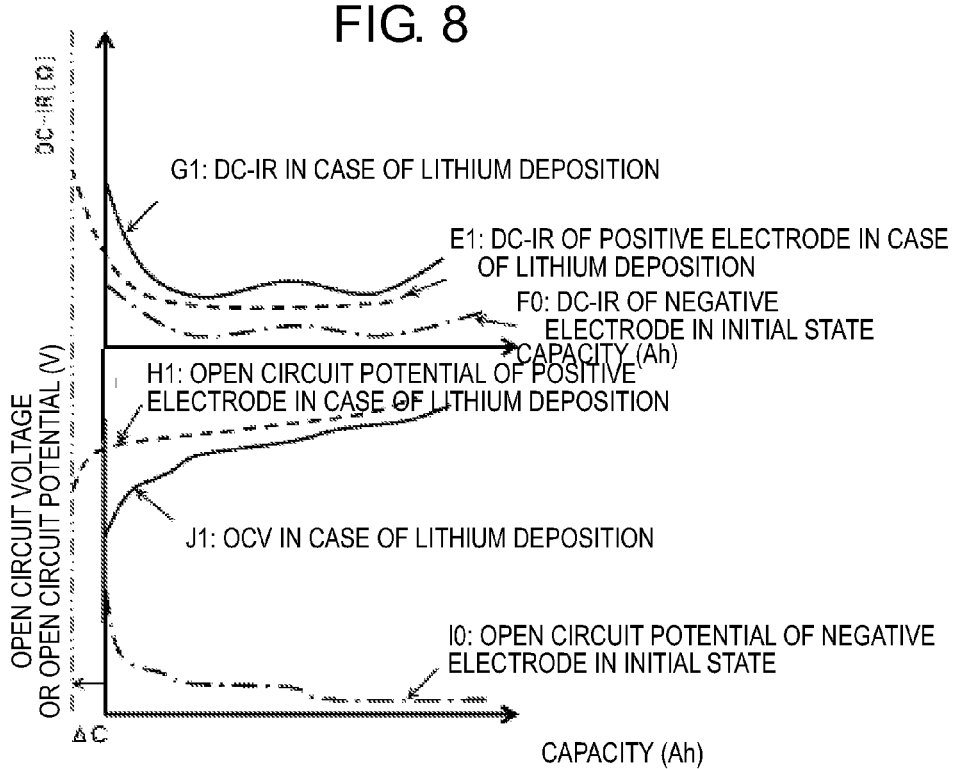
FIG. 8 is a conceptual diagram showing correspondence relations between the DC-IR and the open circuit voltage, and the capacity in the lithium-ion secondary battery in which lithium-deposition-related deterioration has occurred.

Therefore, when the positive electrode composition and the negative electrode composition do not equally correspond to each other because of lithium-deposition-related deterioration, the DC-IR of the positive electrode in the case where the lithium-deposition-related deterioration has occurred is shifted to the left (the direction in which the capacity is smaller) as shown in FIG. 8; and along with the shift, the open circuit potential of the positive electrode in the case where the lithium deposition has occurred is also shifted to the left (the shift amount of the capacity is represented by $\Delta C$ in FIG. 8).

That is to say, as shown in the lower side of FIG. 8, even when lithium-deposition-related deterioration has occurred, the open circuit potential of the negative electrode does not change but remains to be the open circuit potential I0 of the negative electrode in the initial state. On the other hand, the open circuit potential H1 of the positive electrode in the case where the lithium-deposition-related deterioration has occurred is obtained by parallel displacing to the left the open circuit potential H0 of the positive electrode in the initial state. The OCV J1 in the case where the lithium-deposition-related deterioration has occurred is represented by the voltage difference between the open circuit potential H1 of the positive electrode in the case where the lithium-deposition-related deterioration has occurred and the open circuit potential I0 of the negative electrode in the initial state.

In view of the above, it is possible to experimentally obtain the following two shift amounts in the case where lithium-deposition-related deterioration has occurred. One is a shift amount by which the curved line representing the correspondence relation between the DC-IR and the capacity is displaced in the capacity direction, and the other is a shift amount by which the curved line representing the correspondence relation between the open circuit voltage and the capacity is displaced in the capacity direction.

Therefore, in the method according to the exemplary embodiment of the present invention for correcting the SOC-OCV table, a compensation amount $\Delta C$ is calculated based on the variation amount of the DC-IR in the case where lithium-deposition-related deterioration has occurred, and the compensation amount $\Delta C$ is used to correct the SOC-OCV table.

Since the SOC-OCV table is corrected based on the DC-IR of the lithium-ion secondary battery as describe above, the correction can be performed without interfering with charge or discharge operation.

In the following, battery-state estimation device 422 based on the above-described configuration will be described. Battery-state estimation device 422 includes storage 4220, OCV estimator 4221, DC-IR obtaining unit 4222, lithium-deposition determination unit 4223, table updating unit 4224, and SOC estimator 4225.

Storage 4220 stores the first resistance value and the second resistance value when the lithium-ion secondary battery is in the initial state (also referred to as a "first timing"). Storage 4220 stores an I-V table showing the correspondence relation between the terminal voltage of the lithium-ion secondary battery and the charging and discharging currents. Storage 4220 stores the SOC-OCV table (also referred to as "first data") showing the correspondence relation between the SOC and the OCV. Storage 4220 stores a table showing the correspondence relation between the open circuit potential of the positive electrode and the capacity of the positive electrode and the correspondence relation between the open circuit potential of the negative electrode and the capacity of the negative electrode (the table is also referred to as "second data"). Storage 4220 further stores a table showing the correspondence relation between (i) a plurality of combinations each including the open circuit potential of the positive electrode and the open circuit potential of the negative electrode and (ii) the DC-IR and the capacity of each of the positive electrode and the negative electrode (the table is also referred to as "third data"). The second data and the third data will be described later in detail.

OCV estimator 4221 refers to the I-V table, based on the voltage value Vd received from voltage sensor 430 and on the current value Id received from current sensor 440, and estimates the OCV. OCV estimator 4221 outputs the estimated OCV to DC-IR obtaining unit 4222, table updating unit 4224, and SOC estimator 4225.

DC-IR obtaining unit 4222 obtains the first resistance value and the second resistance value from storage 4220. Further, at a second timing after a certain period of time has elapsed from the first timing, DC-IR obtaining unit 4222 calculates a resistance value Rd of the DC-IR corresponding to the OCV by using the following equation (5), based on the voltage value Vd received from voltage sensor 430, on the current value Id received from current sensor 440, and on the OCV received from OCV estimator 4221.

$$Rd = (Vd - OCV)/Id \quad (5)$$

When the OCV becomes the first open circuit voltage V1, DC-IR obtaining unit 4222 obtains the third resistance value by using the equation (5), and when the OCV becomes the second open circuit voltage V2, DC-IR obtaining unit 4222 obtains the fourth resistance value. DC-IR obtaining unit 4222 outputs the obtained first to fourth resistance values to lithium-deposition determination unit 4223 and table updating unit 4224.

Based on the first resistance value and the third resistance value received from DC-IR obtaining unit 4222, lithium-deposition determination unit 4223 calculates the first difference value D1 by using the equation (1) and the first ratio R1 by using the equation (2). In the same way, based on the second resistance value and the fourth resistance value, lithium-deposition determination unit 4223 calculates the second difference value D2 by using the equation (3) and the second ratio R2 by using the equation (4).

Lithium-deposition determination unit 4223 compares the first difference value D1 with the second difference value D2, and compares the first ratio R1 with the second ratio R2. If the second difference value D2 and the second ratio R2 are greater, lithium-deposition determination unit 4223 determines that lithium deposition has occurred, and lithium-deposition determination unit 4223 outputs a lithium-deposition detection signal to DC-IR obtaining unit 4222 and table updating unit 4224.

As described above, the increase amount of the DC-IR due to wear deterioration is almost the same in the first range and the second range. In addition, even when lithium-deposition-related deterioration and wear deterioration have occurred, the variation amount of the DC-IR in the second range is almost the same as the increase amount due to the wear deterioration. Therefore, upon receiving the lithium-deposition detection signal, table updating unit 4224 calculates, by using the following equation (6), the variation amount of the DC-IR, in the first range, due to lithium-deposition-related deterioration.

$$RLi = R1b - (R2b - R2a) \quad (6)$$

Based on RLi, table updating unit 4224 refers to the third data, and calculates the compensation amount ΔC. Here, the third data will be specifically described.

Figures 9, 10:
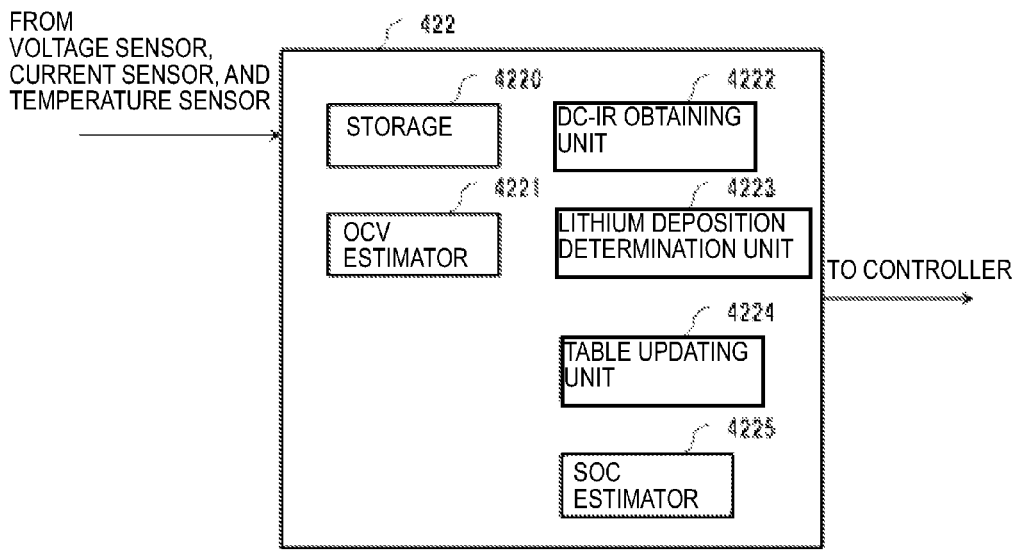
FIG. 9 is a diagram showing a configuration example of a battery-state estimation device according to an exemplary embodiment of the present invention.
FIG. 10 is a conceptual diagram of a table showing a correspondence relation between (i) a plurality of combinations each including an open circuit potential of a positive electrode and an open circuit potential of a negative electrode and (ii) the DC-IR and the capacity of each of the positive electrode and the negative electrode.

As shown in FIG. 10, in the third data there is described a correspondence relation between (i) the combinations each of which includes the open circuit potential of the positive electrode and the open circuit potential of the negative electrode and is equal to the first open circuit voltage V1 and (ii) the DC-IR and the capacity of each of the positive electrode and the negative electrode. In the column of "open circuit voltages of positive electrode and negative electrode", the n number of the open circuit potentials V1C1 to V1Cn of the positive electrode and the n number of the open circuit potentials V1A1 to V1An of the negative electrode are combined such that the difference between the open circuit potential of the positive electrode and the open circuit potential of the negative electrode is equal to the first open circuit voltage V1. In the same way, the column of "DC-IR" and the column of "C" for the positive electrode are respectively filled with the values rcj (where j is an integer from 1 to n) of the DC-IR and the values ccj of the capacity of the positive electrode in the case where the open circuit potential of the positive electrode is V1Cj. In the same way, the column of "DC-IR" and the column of "C" for the negative electrode are respectively filled with the values raj of the DC-IR and the values caj of the capacity of the negative electrode in the case where the open circuit potential of the negative electrode is V1Aj. If the lithium-ion secondary battery is kept at a low temperature, only lithium is deposited. Therefore, the third data can be prepared (i) by selecting a plurality of sets of the open circuit potential of the positive electrode and the open circuit potential of the negative electrode each of which sets is equal to the first open circuit voltage V1 and (ii) by experimentally obtaining the DC-IR and the capacity for each set.

As described above, the DC-IR due to lithium-deposition-related deterioration is obtained by combining the DC-IR of the positive electrode with the DC-IR of the negative electrode in the case where the lithium deposition has occurred. Therefore, table updating unit 4224 calculate rcj+raj by referring to the column of "DC-IR" for the positive electrode in the third data and the column of "DC-IR" for the negative electrode. Thus, the combination of the open circuit potential of the positive electrode and the open circuit potential of the negative electrode (V1Cj and V1Aj) which is closest to RLi is obtained. If the open circuit potential of the positive electrode and the open circuit potential of the negative electrode which make the first open circuit voltage V1 in the case where the lithium deposition has occurred are once obtained, the capacity ccj of the positive electrode and the capacity caj of the negative electrode can be obtained at that time only by referring to the third data. The difference ccj−caj between the both capacities corresponds to the compensation amount ΔC. In this way, table updating unit 4224 obtains compensation amount ΔC by referring, based on RLi, to the third data.

Next, table updating unit 4224 subtracts the compensation amount ΔC from the capacity of the positive electrode to correct the correspondence relation between the open circuit potential of the positive electrode and the capacity of the positive electrode described in the second data. Table updating unit 4224 combines (i) the corrected correspondence relation between the open circuit potential of the positive electrode and the capacity of the positive electrode with (ii) the correspondence relation between the open circuit potential of the negative electrode and the capacity of the negative electrode described in the second data; thus, table updating unit 4224 obtains the correspondence relation between the open circuit voltage and the capacity in the case where lithium deposition has occurred. Table updating unit 4224 obtains the capacity corresponding to the open circuit voltage (for example, 3.0 V) when the SOC is 0% and the capacity corresponding to the open circuit voltage (for example, 4.2 V) when the SOC is 100%, from the correspondence relation between the open circuit voltage and the capacity in the case where lithium deposition has occurred, and table updating unit 4224 thus converts the capacity into the SOC and updates the SOC-OCV table. Table updating unit 4224 outputs the updated SOC-OCV table to storage 4220.

SOC estimator 4225 accumulates the current value Id received from current sensor 440 and estimates the SOC, based on the accumulated current. Further, SOC estimator 4225 refers to the SOC-OCV table stored in storage 4220, based on the OCV received from OCV estimator 4221 and estimates the SOC, based on the OCV. When charge or discharge is not being performed, SOC estimator 4225 adopts the SOC estimated based on the OCV. On the other hand, when charge or discharge is being performed, SOC estimator 4225 adopts the SOC estimated based on the accumulated current without correction or adopts the SOC corrected based on the SOC estimated based on the OCV. SOC estimator 4225 outputs the adopted SOC to communication unit 424.

Figure 11:
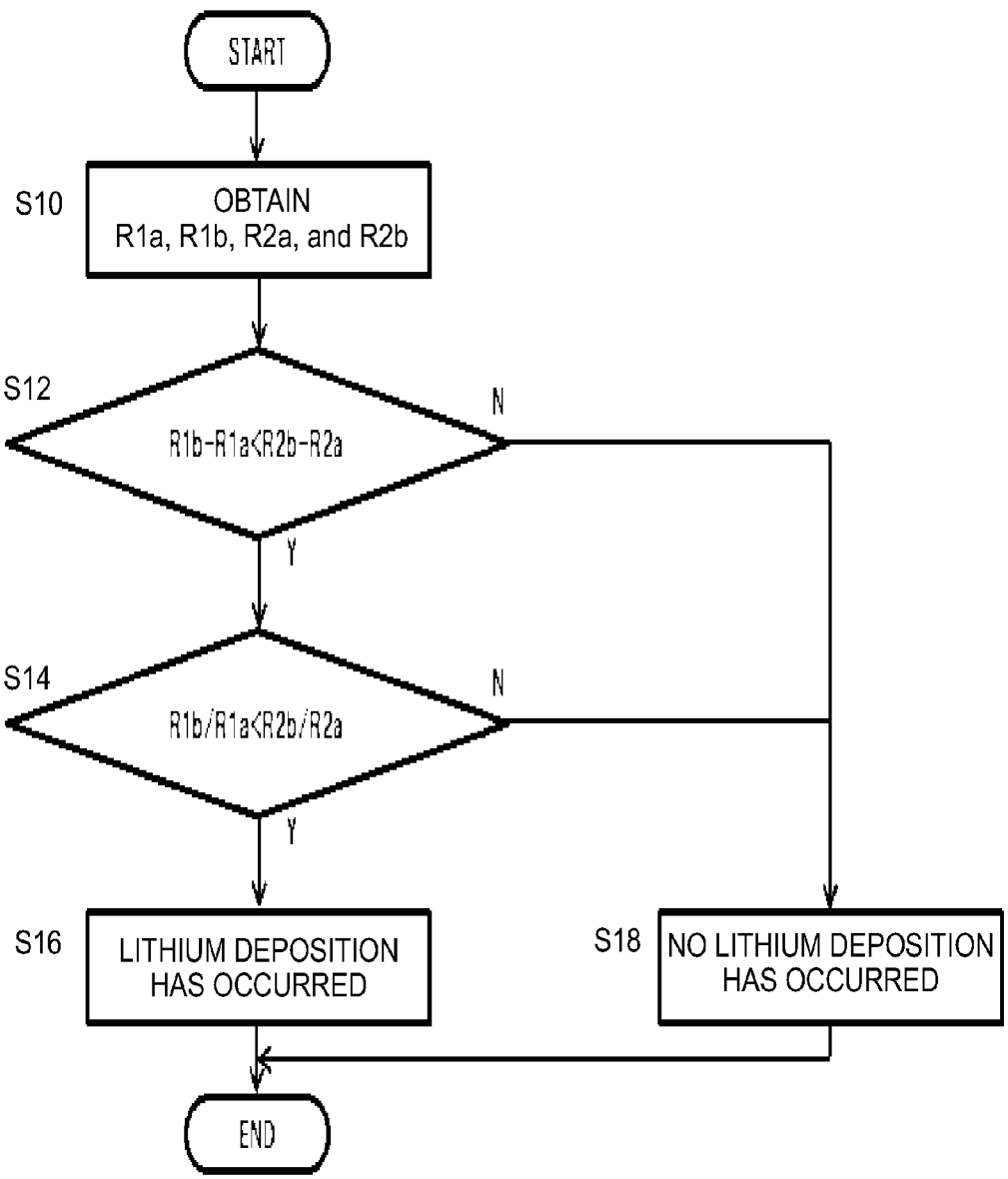
FIG. 11 is an operational flowchart related to determination of lithium deposition in the exemplary embodiment of the present invention.

Operation of battery-state estimation device 422 having the above-described configuration will be described. FIG. 11 is an operational flowchart related to determination of lithium deposition. DC-IR obtaining unit 4222 obtains the first resistance value R1a, the second resistance value R2a, the third resistance value R1b, and the fourth resistance value R2b (step S10). Lithium-deposition determination unit 4223 calculates the first difference value D1, the first ratio R1, the second difference value D2, and the second ratio R2. If the second difference value D2 is greater (step S12: Y) and if the second ratio R2 is greater (step S14: Y), lithium-deposition determination unit 4223 determines that lithium deposition has occurred (step S16). Otherwise, (step S12: N or step S14: N), lithium-deposition determination unit 4223 determines that lithium deposition has not occurred (step S18).

In the exemplary embodiment of the present invention, lithium-deposition determination unit 4223 performs the determination of lithium deposition, based on the magnitude relation between the variation amount of the DC-IR in the second range and the variation amount of the DC-IR in the first range. Therefore, the determination of lithium deposition can be simply performed without interfering with the charge or discharge operation. DC-IR obtaining unit 4222 adopts as the threshold voltage Vth the open circuit voltage which is lower than the open circuit voltage corresponding to the local maximum DC-IR and at which the DC-IR is equal to the local maximum DC-IR, and DC-IR obtaining unit 4222 divides the open circuit voltage into the first range and the second range, where the first range is a range in which the open circuit voltage is lower than the threshold voltage Vth, and the second range is a range in which the open circuit voltage is higher than the threshold voltage Vth. Therefore, lithium deposition can be accurately determined. Lithium-deposition determination unit 4223 determines that lithium deposition has occurred if the second difference value D2 is greater than the first difference value D1 and if the second ratio R2 is greater than the first ratio R1; therefore, lithium deposition can be surely determined. Table updating unit 4224 updates the SOC-OCV table, based on the variation amount of the DC-IR in the second range and the variation amount of the DC-IR in the first range; therefore, the update can be simply performed while charge or discharge is being performed.

In the above, the present invention is described based on the exemplary embodiment. This exemplary embodiment is just an example, and it is understood by a person skilled in the art that various modified examples may be made according to the combination of the components and the processes in the present embodiment and that those modified examples are in the scope of the present invention.

For example, it is described in the exemplary embodiment of the present invention that, if the second difference value D2 and the second ratio R2 are greater, lithium-deposition determination unit 4223 determines that lithium deposition has occurred. However, even in the case where the second difference value D2 is smaller than the first difference value D1, it is also possible to determine that lithium deposition has occurred if the second ratio R2 is greater than the first ratio R1. The reason for this is as follows. The DC-IR in the initial state is greater in the first range than in the second range as in the FIG. 5; therefore, in the case where the variation amount of the DC-IR is approximately the same in the first and second ranges, even if the DC-IR is almost the same in the first and second ranges when compared by the difference value, the DC-IR is in some cases greater in the second range than in the first range when compared by the ratio.

Figure 12:
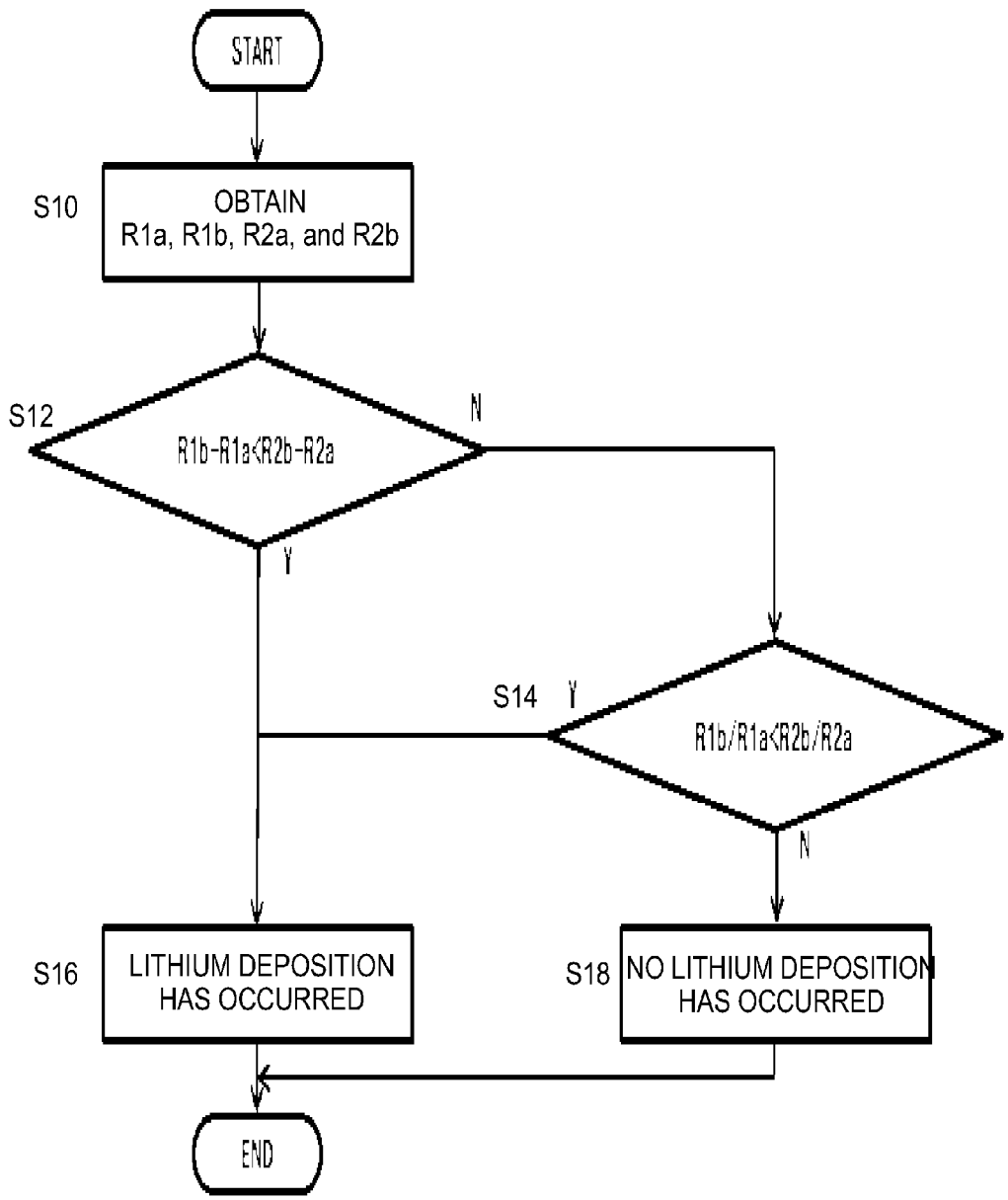
FIG. 12 is an operational flowchart related to determination of lithium deposition in a modified example of the exemplary embodiment of the present invention.

The operation of battery-state estimation device 422 having the above configuration will be described. FIG. 12 is an operational flowchart related to the determination of lithium deposition. DC-IR obtaining unit 4222 obtains the first resistance value R1a, the second resistance value R2a, the third resistance value Rib, and the fourth resistance value R2b (step S10). Lithium-deposition determination unit 4223 calculates the first difference value D1, the first ratio R1, the second difference value D2, and the second ratio R2. If the second difference value D2 is greater (step S12: Y), lithium-deposition determination unit 4223 determines that lithium deposition has occurred (step S16). On the other hand, in the case where the second difference value D2 is not greater (step S12: N), if the second ratio R2 is greater (step S14: Y), lithium-deposition determination unit 4223 determines that lithium deposition has occurred (step S16). Otherwise (step S14: N), lithium-deposition determination unit 4223 determines that lithium deposition has not occurred (step S18).

With the present modified example, even if it is difficult to evaluate the variation amount of the DC-IR by the difference value, lithium deposition can be determined.

Further, it is described in the exemplary embodiment of the present invention that table updating unit 4224 updates the SOC-OCV table; however, in addition to that, table updating unit 4224 may update a table which shows the correspondence relation between the DC-IR and the SOC (the table is referred to as "fourth data").

Specifically, storage 4220 stores a table showing the correspondence relation between the DC-IR of the positive electrode and the capacity of the positive electrode and the correspondence relation between the DC-IR of the negative electrode and the capacity of the negative electrode (the table is also referred to as "fifth data"). Table updating unit 4224 corrects the correspondence relation, described in the fifth data, between the DC-IR of the positive electrode and the capacity of the positive electrode by subtracting the compensation amount ΔC from the capacity of the positive electrode. Table updating unit 4224 combines (i) the corrected correspondence relation between the DC-IR of the positive electrode and the capacity of the positive electrode with (ii) the correspondence relation, described in the fifth data, between the DC-IR of the negative electrode and the capacity of the negative electrode, and table updating unit 4224 thus obtains the correspondence relation between the DC-IR and the capacity in the case where lithium deposition has occurred. Further, table updating unit 4224 combines the correspondence relation between the DC-IR and the capacity in the case where lithium deposition has occurred with the second difference value D2, which is the increase amount due to wear deterioration, and table updating unit 4224 thus obtains the correspondence relation between the DC-IR and the capacity in the case where the lithium deposition and the wear deterioration have occurred. Table updating unit 4224 obtains, in the same way as in the case of SOC-OCV table, the capacity corresponding to the DC-IR when the SOC is 0% and the capacity corresponding to the DC-IR when the SOC is 100% from the correspondence relation between the DC-IR and the capacity in the case where lithium deposition and wear deterioration have occurred, and table updating unit 4224 thus converts the capacity into the SOC and updates the table showing the correspondence relation between the DC-IR and the SOC. Table updating unit 4224 outputs the updated table showing the correspondence relation between the DC-IR and the SOC to storage 4220. According to the modified example, table updating unit 4224 updates the table showing the correspondence relation between the DC-IR and the SOC, based on the variation amount of the DC-IR in the second range and the variation amount of the DC-IR in the first range; therefore, the update can be simply performed while charge or discharge is being performed.

Note that the invention according to the present exemplary embodiment may also be specified by the items described below.

[Item 1]

A battery-state estimation device includes: an obtaining unit which obtains, at a first timing, a first resistance value corresponding to a first open circuit voltage of a lithium-ion secondary battery and a second resistance value corresponding to a second open circuit voltage, which is higher than the first open circuit voltage, of the lithium-ion secondary battery and which obtains, at a second timing which is different from the first timing, a third resistance value corresponding to the first open circuit voltage and a fourth resistance value corresponding to the second open circuit voltage; and a determination unit which determines presence or absence of lithium deposition in the lithium-ion secondary battery, based on a magnitude relation between a first variation amount of the third resistance value with respect to the first resistance value and a second variation amount of the fourth resistance value with respect to the second resistance value.

[Item 2]

The lithium-ion secondary battery according to Item 1 has, in a correspondence relation between an internal resistance and an open circuit voltage, a peak internal resistance at which the internal resistance stops increasing and starts decreasing with increase in the open circuit voltage; the lithium-ion secondary battery has a third open circuit voltage which is lower than an open circuit voltage corresponding to the peak internal resistance and at which an internal resistance is equal to the peak internal resistance; the obtaining unit divides a range of the open circuit voltage into a first range in which the open circuit voltage is lower than the third open circuit voltage and a second range in which the open circuit voltage is higher than the third open circuit voltage; the first open circuit voltage is in the first range; and the second open circuit voltage is in the second range.

[Item 3]

In the battery-state estimation device according to Item 2, the determination unit uses a first difference value or a first ratio as the first variation amount, and uses a second difference value or a second ratio as the second variation amount; the first difference value is obtained by calculating a difference between the first resistance value and the third resistance value; the first ratio is obtained by calculating a ratio of the third resistance value to the first resistance value; the second difference value is obtained by calculating a difference between the second resistance value and the fourth resistance value; and the second ratio is obtained by calculating a ratio of the fourth resistance value to the second resistance value.

[Item 4]

In the battery-state estimation device according to Item 3, the determination unit compares the first difference value with the second difference value, and compares the first ratio with the second ratio, and when at least the second ratio is greater than the first ratio, the determination unit determines that lithium is deposited.

[Item 5]

The battery-state estimation device according to Item 4, further includes: a storage configured to store first data which shows a correspondence relation between a charging rate and an open circuit voltage of the lithium-ion secondary battery and configured to store second data which shows a correspondence relation between an open circuit voltage and a capacity of the lithium-ion secondary battery; and an updating unit which updates the first data, based on the first to fourth resistance values and the second data.

A battery-state estimation device according to the present invention can be usefully used for a backup power source and an electric vehicle, as a storage battery system having a battery-state estimation function.

The invention claimed is:

1. A battery-state estimation device comprising:
an obtaining unit which obtains, at a first timing, a first resistance value corresponding to a first open circuit voltage of a lithium-ion secondary battery and a second resistance value corresponding to a second open circuit voltage, which is higher than the first open circuit voltage, of the lithium-ion secondary battery and which obtains, at a second timing which is different from the first timing, a third resistance value corresponding to the first open circuit voltage and a fourth resistance value corresponding to the second open circuit voltage; and
a determination unit which determines presence or absence of lithium deposition in the lithium-ion secondary battery, based on a magnitude relation between a first variation amount of the third resistance value with respect to the first resistance value and a second variation amount of the fourth resistance value with respect to the second resistance value,
wherein the lithium-ion secondary battery has, in a correspondence relation between an internal resistance and an open circuit voltage, a peak internal resistance at which the internal resistance stops increasing and starts decreasing with increase in the open circuit voltage,
the lithium-ion secondary battery has a third open circuit voltage which is lower than an open circuit voltage corresponding to the peak internal resistance and at which an internal resistance is equal to the peak internal resistance,
the obtaining unit divides a range of the open circuit voltage into a first range in which the open circuit voltage is lower than the third open circuit voltage and a second range in which the open circuit voltage is higher than the third open circuit voltage,
the first open circuit voltage is in the first range, and
the second open circuit voltage is in the second range.

2. The battery-state estimation device according to claim 1, wherein
the determination unit uses a first difference value or a first ratio as the first variation amount, and uses a second difference value or a second ratio as the second variation amount,
the first difference value is obtained by calculating a difference between the first resistance value and the third resistance value,
the first ratio is obtained by calculating a ratio of the third resistance value to the first resistance value,
the second difference value is obtained by calculating a difference between the second resistance value and the fourth resistance value, and
the second ratio is obtained by calculating a ratio of the fourth resistance value to the second resistance value.

3. The battery-state estimation device according to claim 2, wherein
the determination unit compares the first difference value with the second difference value, and compares the first ratio with the second ratio, and
when at least the second ratio is greater than the first ratio, the determination unit determines that lithium is deposited.

4. The battery-state estimation device according to claim 3, further comprising:
a storage configured to store first data which shows a correspondence relation between a charging rate and an open circuit voltage of the lithium-ion secondary battery and configured to store second data which shows a correspondence relation between an open circuit voltage and a capacity of the lithium-ion secondary battery; and an updating unit which updates the first data, based on the first to fourth resistance values and the second data.

\* \* \* \* \*